(12) United States Patent
Monro (10) Patent No.: US 7,671,767 B2
(45) Date of Patent: Mar. 2, 2010

(54) LIFO RADIX CODER FOR ELECTRICAL COMPUTERS AND DIGITAL DATA PROCESSING SYSTEMS

(76) Inventor: Donald Martin Monro, 6, The Lays, Goose Street, Beckington, Somerset (GB) BA11 6RS ( * ) Notice: Subject to any disclaimer, the term of this patent is extended or adjusted under 35 U.S.C. 154(b) by 376 days.

(21) Appl. No.: 11/777,081

(22) Filed: Jul. 12, 2007

(65) Prior Publication Data

US 2009/0019128 A1 Jan. 15, 2009

(51) Int. Cl.
*H03M 7/02* (2006.01)
(52) U.S. Cl. .......................... 341/83; 341/51
(58) Field of Classification Search .......... 341/51, 341/83
See application file for complete search history.

(56) References Cited

U.S. PATENT DOCUMENTS

| | | | | |
|---|---|---|---|---|
| 3,626,167 | A * | 12/1971 | Guck et al. | ............. 341/82 |
| 4,168,513 | A | 9/1979 | Hains et al. | |
| 4,509,038 | A | 4/1985 | Hirano | |
| 4,792,793 | A * | 12/1988 | Rawlinson et al. | ......... 341/89 |
| 5,748,786 | A | 5/1998 | Zandi et al. | |
| 5,754,704 | A | 5/1998 | Barnsley et al. | |
| 5,768,437 | A | 6/1998 | Monro | |
| 6,078,619 | A | 6/2000 | Monro | |
| 6,272,241 | B1 | 8/2001 | Tattersall | |
| 6,373,411 | B1 | 4/2002 | Shoham | |
| 6,556,719 | B1 | 4/2003 | Monro | |
| 6,990,145 | B2 | 1/2006 | Monro | |
| 7,015,837 | B1 | 3/2006 | Malvar | |
| 7,030,789 | B1 | 4/2006 | Cideciyan et al. | |
| 7,082,483 | B2 | 7/2006 | Poo | |
| 7,155,445 | B1 | 12/2006 | Kling et al. | |
| 7,265,691 | B2 | 9/2007 | Tomic | |
| 7,340,013 | B2 | 3/2008 | Ammer et al. | |
| 2004/0126018 | A1 | 7/2004 | Monro | |
| 2004/0165737 | A1 | 8/2004 | Monro | |

FOREIGN PATENT DOCUMENTS

| | | |
|---|---|---|
| EP | 0595599 A2 | 5/1994 |
| EP | EP0836325 | 4/1998 |
| EP | 0 939 554 A2 | 9/2001 |
| GB | 2293733 A | 4/1996 |
| WO | WO97/16029 | 5/1997 |
| WO | WO 99/08449 | 2/1999 |
| WO | WO 01/63935 A1 | 8/2001 |

OTHER PUBLICATIONS

R.F. Rice, "Some Practical Universal Noiseless Coding Techniques," Jet Propulsion Laboratory, Pasadena, California, JPL Publication 79-22, Mar. 1979.
Notice of Allowance from U.S. Appl. No. 11/776,786, mailed Jun. 17, 2009.

(Continued)

*Primary Examiner*—Khai M Nguyen (57) ABSTRACT

Embodiments described herein may include example embodiments of a method, article and/or apparatus for coding data which may be used for communicating between two or more components connected to an interconnection medium (e.g., a bus) within a single computer or digital data processing system, and/or for communication between computing platforms via a network or other interconnection medium.

48 Claims, 5 Drawing Sheets

OTHER PUBLICATIONS

De Natale, et al., "A Mesh-Interpolation Scheme for Very-Low Bitrate Coding of Video Sequences" European Transactions on Telecommunications, vol. 9, No. 1, pp. 47-55, 1998.

Tian et al., "Image Data Processing in the Compressed Wavelet Domain" Proceedings of ICSP'96, pp. 978-981, 1996.

Said et al., "A New, Fast, and Efficient Image Codec Based on Set Partitioning in Hierarchical Trees" IEEE Transactions on Circuits and Systems for Video Technology, vol. 6, No. 3, pp. 243-250, Jun. 1996.

U.S. Appl. No. 11/777,256, filed Jul. 12, 2007, Monro.
U.S. Appl. No. 11/777,239, filed Jul. 12, 2007, Monro.
U.S. Appl. No. 11/777,230, filed Jul. 12, 2007, Monro.
U.S. Appl. No. 11/777,144, filed Jul. 12, 2007, Monro.
U.S. Appl. No. 11/777,130, filed Jul. 12, 2007, Monro.
U.S. Appl. No. 11/777,122, filed Jul. 12, 2007, Monro.
U.S. Appl. No. 11/777,100, filed Jul. 12, 2007, Monro.
U.S. Appl. No. 11/777,022, filed Jul. 12, 2007 Monro.
U.S. Appl. No. 11/776,786, filed Jul. 12, 2007, Monro.
U.S. Appl. No. 11/422,316, filed Jun. 5, 2006, Monro.

Shapiro, "Embedded Image Coding Using Zerotrees of Wavelet Coefficients" IEEE Transactions on Signal Processing, vol. 41, No. 12, pp. 3445-3462, Dec. 1993.

Horst et al., "Mupcos: A multi-purpose coding scheme" Signal Processing: Image Communication 5, pp. 75-89, 1993.

International Search Report and Written Opinion for PCT/US2008/069539 completed Sep. 5, 2008.

International Search Report and Written Opinion for PCT/US2008/069543 completed Sep. 5, 2008.

Communication and Written Opinion for PCT/US2008/069497 mailed Oct. 9, 2008.

Communication and Written Opinion for PCT/US2008/069317 mailed Oct. 9, 2008.

International Search Report and Written Opinion for PCT/US2008/069502 mailed Nov. 3, 2008.

Anonymous: Conversion Between Different Number Systems Internet Article, [Online] Nov. 11, 2002, XP002494744. Retrieved from the Internet: URL: http://www.cstc.org/data/resources/60/convexp.html> [retrieved on Sep. 5, 2008] the whole document.

Bose B. et al., "Lee Distance Gray Codes," Information Theory, 1995. Proceedings, 1995 IEEE International Symposium on Whistler, BC, Canada Sep. 17-22, 1995, New York, NY, USA, IEEE US, Sep. 17, 1995, p. 236.

* cited by examiner

LIFO RADIX CODER FOR ELECTRICAL COMPUTERS AND DIGITAL DATA PROCESSING SYSTEMS

FIELD

This disclosure is related to data coding, such as, for example, data compression within electrical computers and digital data processing systems. Subject matter disclosed herein may relate to processes or apparatus for transferring data from one or more peripherals to one or more computers or digital data processing systems for the latter to process, store, and/or further transfer and/or for transferring data from the computers or digital data processing systems to the peripherals. Subject matter disclosed herein may relate to processes or apparatus for interconnecting or communicating between two or more components connected to an interconnection medium a within a single computer or digital data processing system. Subject matter disclosed herein may relate to processes or apparatus for transferring data from one computer or digital processing system to another computer or digital processing system via a network or other interconnection medium.

BACKGROUND

Data sharing between portions of a computing platform and/or over networks has become more and more common in recent years. However, bandwidth is typically a limiting factor when sharing data between portions of a computing platform and/or over networks. It may be desirable to code data, such as by data compression prior to transmitting the data between portions of a computing platform and/or over a network. Additionally, for similar reasons it may be desirable to code and/or compress data before storing data on a storage medium. Accordingly, compression may be used, for example, in storing data on magnetic or other media, in transferring data from one component to another within a computing platform, and/or in transferring data to and/or from a peripheral device to and/or from a computing platform.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Embodiments claimed may include one or more apparatuses for performing the operations herein. These apparatuses may be specially constructed for the desired purposes, or they may comprise a general purpose computing platform selectively activated and/or reconfigured by a program stored in the device. The processes and/or displays presented herein are not inherently related to any particular computing platform and/or other apparatus. Various general purpose computing platforms may be used with programs in accordance with the teachings herein, or it may prove convenient to construct a more specialized computing platform to perform the desired method. The desired structure for a variety of these computing platforms will appear from the description below.

Embodiments claimed may include algorithms, programs and/or symbolic representations of operations on data bits or binary digital signals within a computer memory capable of performing one or more of the operations described herein. Although the scope of claimed subject matter is not limited in this respect, one embodiment may be in hardware, such as implemented to operate on a device or combination of devices, whereas another embodiment may be in software. Likewise, an example embodiment may be implemented in firmware, or as any combination of hardware, software, and/or firmware, for example. These algorithmic descriptions and/or representations may include techniques used in the data processing arts to transfer the arrangement of a computing platform, such as a computer, a computing system, an electronic computing device, and/or other information handling system, to operate according to such programs, algorithms, and/or symbolic representations of operations. A program and/or process generally may be considered to be a self-consistent sequence of acts and/or operations leading to a desired result. These include physical manipulations of physical quantities. Usually, though not necessarily, these quantities take the form of electrical and/or magnetic signals capable of being stored, transferred, combined, compared, and/or otherwise manipulated. It has proven convenient at times, principally for reasons of common usage, to refer to these signals as bits, values, elements, symbols, characters, terms, numbers and/or the like. It should be understood, however, that all of these and/or similar terms are to be associated with the appropriate physical quantities and are merely convenient labels applied to these quantities. In addition, embodiments are not described with reference to any particular programming language. It will be appreciated that a variety of programming languages may be used to implement the teachings described herein.

Likewise, although the scope of claimed subject matter is not limited in this respect, one embodiment may comprise one or more articles, such as a storage medium or storage media. This storage media may have stored thereon instructions that when executed by a computing platform, such as a computer, a computing system, an electronic computing device, and/or other information handling system, for example, may result in an embodiment of a method in accordance with claimed subject matter being executed, for example. In the following description and/or claims, the terms "storage medium" and/or "storage media" as referred to herein relate to media capable of maintaining expressions which are perceivable by one or more machines. For example, a storage medium may comprise one or more storage devices for storing machine-readable instructions and/or information. Such storage devices may comprise any one of several media types including, but not limited to, any type of magnetic storage media, optical storage media, semiconductor storage media, disks, floppy disks, optical disks, CD-ROMs, magnetic-optical disks, read-only memories (ROMs), random access memories (RAMs), electrically programmable read-only memories (EPROMs), electrically erasable and/or programmable read-only memories (EEPROMs), flash memory, magnetic and/or optical cards, and/or any other type of media suitable for storing electronic instructions, and/or capable of being coupled to a system bus for a computing platform. However, these are merely examples of a storage medium, and the scope of claimed subject matter is not limited in this respect.

In the following description and/or claims, the term "instructions" as referred to herein relates to expressions which represent one or more logical operations. For example, instructions may be machine-readable by being interpretable by a machine for executing one or more operations on one or more data objects. However, this is merely an example of instructions, and the scope of claimed subject matter is not limited in this respect. In another example, instructions as referred to herein may relate to encoded commands which are executable by a processor having a command set that includes the encoded commands. Such an instruction may be encoded in the form of a machine language understood by the processor. However, these are merely examples of an instruction, and the scope of claimed subject matter is not limited in this respect.

Unless specifically stated otherwise, as apparent from the following discussion, it is appreciated that throughout this specification discussions utilizing terms such as processing, computing, calculating, selecting, forming, enabling, inhibiting, identifying, initiating, receiving, transmitting, determining, displaying, sorting, delivering, appending, making, presenting, distorting and/or the like refer to the actions and/or processes that may be performed by a computing platform, such as a computer, a computing system, an electronic computing device, and/or other information handling system, that manipulates and/or transforms data represented as physical electronic and/or magnetic quantities and/or other physical quantities within the computing platform's processors, memories, registers, and/or other information storage, transmission, reception and/or display devices. Further, unless specifically stated otherwise, processes described herein, with reference to flow diagrams or otherwise, may also be executed and/or controlled, in whole or in part, by such a computing platform.

In the following description and/or claims, the term "and/or" as referred to herein may mean "and", it may mean "or", it may mean "exclusive-or", it may mean "one", it may mean "some, but not all", it may mean "neither", and/or it may mean "both", although the scope of claimed subject matter is not limited in this respect.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

Although claimed subject matter is not so limited, one potential, although not exclusive, application of an embodiment may be in the field of transmitting data to and/or from input/output portions of a computing platform. Data may be transmitted to other portions of a computing platform and/or from a computing platform to another entity, such as a network or additional computing platform. It may be desirable in this particular field, for example, to compress data relatively efficiently prior to transmitting. In this and analogous fields, it may also be desirable to transmit information across an interconnect, such as an interconnect that may be subject to restrictions on the number of bits that may be transmitted, or on the bit transmission rate. Therefore, relatively efficient coding may result in more information being transmitted per unit time, for example. Another application, also previously suggested, may be in the compression of data on an electronic device, such as for storage in files, for example. This may, for example, reduce the amount of memory for storage of the particular data, for example, or, as another example, facilitate transmission of the data by reducing the size of an attachment to an email. Of course, claimed subject matter is not limited to these simple examples. These are provided simply for purposes of illustration.

Likewise, embodiments covered by claimed subject matter include, for example, a computer program capable of implementing any such method, and/or a computing device capable of implementing such a method. Embodiments also include hardware and/or software based coder capable of carrying out a method as described below in combination with a hardware and/or software decoder capable of reconstructing an original set or grouping of data from a data code representing a compression of such data. These as well as many other embodiments are intended to be within the scope of claimed subject matter.

In at least some embodiments described, data compression may be lossless, although claimed subject matter is not limited in scope in this respect. Furthermore, in this particular context, any grouping, set, block or portion of associated data to be compressed may be treated as an ordered sequence of characters or other symbols. If such data is representative of text, for example, individual symbols may comprise one or more text characters, but that is, of course, not essential. Many other symbols may also be represented. More generally, symbols may be presented by bytes or other sized groupings of data. It is also possible that longer or short portions of data may be used, which may or may not fit within a byte or digital word length, for example. If data is represented in binary form, a symbol may be represented, depending on the particular embodiment, as a single bit or multiple bits of fixed or variable length.

In one embodiment, symbols may comprise any type, form or format of data. For example, the symbol may include items, such as, for example, records, files, sectors, clusters, groupings and/or portions thereof. In this particular context, any grouping, set, block or portion of associated data to be compressed may be treated as an ordered sequence of characters or other symbols. If, in one embodiment, such data is representative of text, for example, individual symbols may comprise one or more text characters, but, of course, the claimed subject mater is not limited in that respect. More generally, in other embodiments, symbols may comprise words, bytes, bits, text, characters and/or the like. However, these are merely a few illustrative examples to which the claimed subject matter is not limited. In one embodiment, symbol strings may comprise single or multiple symbols. Conversely, in other embodiments, they may be fixed or variable in length.

For one or more embodiments, symbol strings may be coded in a particular or a substantially predetermined order, although, again, this is merely an example embodiment and the claimed subject matter is not limited in scope in this respect. Alternatively or in addition, rather than coding in an order, in another embodiment, symbol strings may be coded in any order. In such an embodiment a symbol string code may be prefixed by some other code indicative of the particular symbol string, for example, although the claimed subject matter is of course not limited in scope to this example embodiment. Likewise, for one or more embodiments, the approach employed may be switchable between modes, such as a mode in which symbol string codes are transmitted or stored in a predetermined order, and a mode in which the order is not predetermined, but in which, in this latter mode, some code representative of a corresponding symbol string is sent before or as part of a symbol string code.

Furthermore, in various embodiments, side or additional information about all or some symbol strings may also be included in the compressed data code. In one or more embodiments, additional information relating to a particular symbol string may be sent at the end of or otherwise associated with a corresponding symbol string code. Alternatively, in another embodiment, additional information may be sent or stored after sending or storing symbol string codes. More generally, in various embodiments, additional information may be provided at any time or in any manner so that a decoder may be capable of associating that information with a corresponding symbol string. In one embodiment, a list or table of symbol strings to be used may be predetermined or predefined, for example. Alternatively or in an additional embodiment, it may be compiled based at least in part on symbol strings which occur in data to be compressed, for example. Additionally or alternatively, if a data grouping includes repetitions of a binary symbol, a first binary symbol code may indicate the number of occurrences of the binary symbol within the data, and a second binary symbol code may select which pattern of the possible combinations describes the positions of the binary symbol code within the data, for example.

Furthermore, in various embodiments, after binary symbol codes for a particular set or grouping of data have been stored or transmitted, an Escape (ESC) code may be used. After positions of binary symbols present in a set of data, except a final binary symbol, have been stored or communicated, positions of the final binary symbol may, in at least some embodiments, be determined. Hence, an encoder may omit storing or communicating positions of such a final binary symbol, for example. However in particular circumstances, such as to code sparse or non-uniformly distributed data, the ESC code may be used if the data is sufficiently sparse that many binary symbol groups are empty, i.e. the data contains no instances of particular binary symbol codes, for example.

As described above, data, such as stored as a file, a record or other unitary association of data, as one example, might be treated as a whole, or instead partitioned or divided into convenient lengths, long enough for symbol groupings, referred to here as binary symbols, to be coded with some amount of compression efficiency and/or short enough to be processed conveniently. Various approaches are described in more detail below. Coding may be carried out by a hardware or software coder. In one possible embodiment, a coder may be arranged to transmit data, after being coded, across a communications channel to a decoder which may be arranged, in real time or otherwise, to use received coded data to reconstruct the set of data. Again, claimed subject matter is not limited in scope to a particular embodiment. Therefore, the embodiments described hereinafter are intended simply as examples for purposes of illustration. Many other approaches and/or embodiments are intended to be included within the scope of claimed subject matter other than these specific examples.

Forming an efficient compressed binary code with data from a range of g symbols which have the same probability has not been a straightforward task if g is not a power of 2. Such data might arise in tossing a die of g sides, for example, or in coding a sequence of equally probable combinations such as might arise in a Combinatorial Coder, as described in co-pending U.S. Patent Application titled COMBINATORIAL CODING/DECODING FOR ELECTRICAL COMPUTERS AND DIGITAL DATA PROCESSING SYSTEMS, by Donald M. Monro; U.S. Patent Application titled BLOCKING FOR COMBINATORIAL CODING/DECODING FOR ELECTRICAL COMPUTERS AND DIGITAL DATA PROCESSING SYSTEMS, by Donald M. Monro; U.S. Patent Application titled IMPROVED BLOCKING FOR COMBINATORIAL CODING/DECODING FOR ELECTRICAL COMPUTERS AND DIGITAL DATA PROCESSING SYSTEMS, by Donald M. Monro, or nearly equally probable combinations such as might arise in Golomb Coding, or other applications that are not described in detail herein, although these are merely example embodiments, and the scope of claimed subject matter is not so limited.

Furthermore, as described herein, a second codeword s of a combinatorial coder may be coded by employing a Last In First Out (LIFO) method. This LIFO method may employ a single or mixed radix, or base, and may additionally interleave data from time to time with bits of binary data. However, embodiments described herein are not limited to implementations including a combinatorial coder, and may employ Golomb coding, for example.

In one embodiment, a message, such as may be stored in memory, may be employed as part of a LIFO method of coding data. For example, a message may be employed as part of an encoding process as performed for a second codeword s of a combinatorial coder. In one embodiment, the length of the message may be known to the coder and/or known to the decoder, although this is not a requirement. Additionally, in one embodiment, a dialogue may take place to inform the decoder of the message length, either initially or as coding progresses. However, these are merely examples, and the scope of the claimed subject matter is not so limited. Furthermore, in the following description and/or claims, the term "message" as referred to herein may mean the contents of a given area of memory used for storing messages and/or may mean a communication containing some information sent by from one area and/or location to another area and/or location, although the scope of claimed subject matter is not limited in this respect. In the following description and/or claims, the term "updated message" as referred to herein may mean replacing or extending an established message, although the scope of claimed subject matter is not limited in this respect.

In a radix coder, a symbol s may be selected that occurs within a set or grouping of data to be coded. In the application to be considered the symbol s may take g different values, which we may take as 0 to g−1 or equivalently 1 to g, since a simple mapping of the actual values of the symbols may be made into either the range 0 to g−1 or 1 to g, or into any other range of g successive values. Where there are g different values, g may be called the range of the values even though a mapping may be advantageous for carrying them into the range 0 to g−1 or any other suitable range. In the application to be considered all of the g different values of s may equally likely to occur, or approximately equally likely, or acceptably equally likely. However the radix coder is not limited to equally likely symbols s. It is well known to experts in the field that if g is a power of 2, a straightforward way of coding such symbols is by $\log_2(g)$ binary bits, and if they are equally likely the code uses the minimum possible number of bits. For example if g is 16, the numbers 0 to 15 may be coded by 4 bits and if all the numbers are equally likely as would be the case in tossing an unbiased 16 sided die, or spinning a wheel of fortune with 16 equally likely outcomes, coding the outcomes by 4 bits achieves the most efficient code, i.e. the shortest binary code, for a sequence of such symbols.

However, those skilled in the art may be aware that a difficulty arises if g is not a power of 2, for example if g is 11, the theoretical minimum number of bits required to code a sequence of 11 equally probable symbols is $\log_2(11)$=3.46 bits per symbol, rounded to two decimal places. However, in binary digital communications, storage, or processing, it is not possible to use 3.46 bits to represent an individual symbol. However, situations often arise in which a sequence of such numbers may be stored or communicated efficiently. One such example might be in storing the outcomes of unbiased die tosses, coin tosses, lottery drawings or wheel of fortune spins or similar random events where the number of possible outcomes is not a power of 2. As will be explained in greater detail below, an application in accordance with one or more embodiments as related to run length coding as will be explained below.

Golomb coding is well-known and described in Golomb, SW: 'Run-length encodings', IEEE Trans. Inf. Theory, 1966, 7, (12), pp. 399-401. Golomb Codes are simply one example of data coding. Therefore, while many of the examples described later are presented in terms of Golomb coding, it should be clear that it is intended that claimed subject matter not be limited in scope simply to Golomb codes (GCs). Other approaches to coding data may be employed and provide satisfactory results. Nonetheless, continuing with Golomb coding as one example, GCs are often used for run length coding, but, in principle, they are general purpose codes that may be used to encode any symbol, or sequence of symbols, as an integer numeral or a sequence of integer numerals. In one possible embodiment, a unique integer numeral may be assigned to a symbol and the symbol may be coded by Golomb coding the corresponding numeral, for example. GCs may have a relative advantage in that the range of numerals need not be known or constrained in advance.

In one particular example, a Golomb Code of a numeral I, module K (where K is the 'base' in this example) may be defined by (S, E, R) as follows:

S=the Sign of the numeral I, if appropriate (may be omitted if the numerals are either all positive or all negative).
M=the Magnitude of I
E=the exponent fix($\log_K(M)$), where fix( ) denotes here a truncation operation, that is, rounding to the next lowest integer numeral.
R=M−$K^E$, is referred to here as a "residual."
The Magnitude of I, therefore, may be obtained by M=$K^E$+R.

It is noted however, that $\log_K(0)$ may provide a mathematical quirk in that K raised to any power may not provide zero. One approach that may be employed to address this includes adding 1 to all non-negative integer numerals so that $\log_K(0)$ may not occur, although, of course, claimed subject matter is not limited in scope in this respect.

At times, out of convenience, for example, K=2, so that a Golomb Code, for example, may provide a form of binary floating point representation of variable length, with exponent E and residual R of variable length E bits. This case which may be known as Rice-Golomb coding, see for example R. F. Rice, "Some Practical Universal Noiseless Coding Techniques," Jet Propulsion Laboratory, Pasadena, Calif., JPL Publication 79-22, March 1979, is illustrated in FIG. 1, for example, although claimed subject matter is not limited in scope in this respect, of course.

In co-pending U.S. patent application Ser. No. 11/422,316, by Monro, filed Jun. 5, 2006, there is described how a Variable Length Coder (VLC), such as, for example, a Huffman Coder, may encode the exponent of a code, such as a Golomb Code, for example, for efficiently coding and compressing a stream of symbols, although this is merely an example embodiment, and the scope of claimed subject matter is not so limited. However, the VLC may be adaptive or static, depending, for example, on the particular embodiment.

Furthermore, it is worthwhile to note that in addition to an embodiment of a method of coding of data, an embodiment may include a computer program incorporating such a method and/or a coder, such as one implemented in hardware, firmware, software, or combinations therefore. Embodiments may also include video and/or audio coders embodying such a method, video and/or audio compression systems whereby data may be encoded according to such a method, and in which such data may then be transmitted across an interconnect and/or a network for reconstruction by a decoder at the far end. Alternatively, the coded data may be stored rather than transmitted. These and many other embodiments are included within the scope of claimed subject matter.

Figure 1:
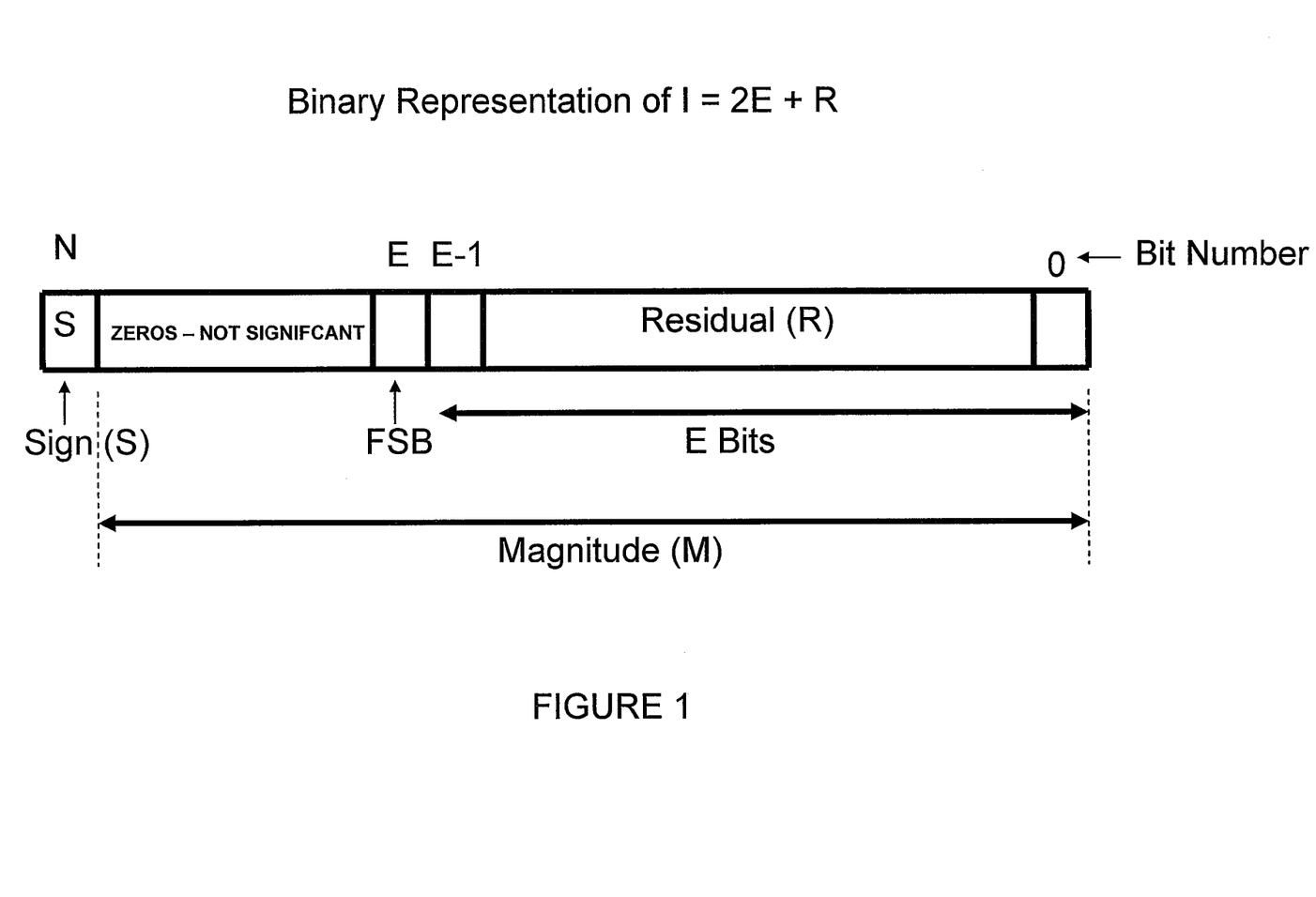
FIG. 1 is a schematic diagram illustrating an example encoded integer in accordance with one or more embodiments.

Referring now to FIG. 1, there is illustrated an example embodiment of a Golomb-coded N bit fixed point binary integer, using sign and magnitude representation. The leading bit S indicates the sign. This is followed by a number of non-significant leading zeros. The first significant bit (FSB) occurs at location E, with the location of the FSB thereby indicating the value of the exponent. The remaining bits may be represented by the subsequent E bits, this being known as the "residual" R in this context. The magnitude M of the integer, in this representation, is simply the value of the binary integer represented by the N bits labeled 0 to N−1.

Here, sign=1 or 0
Likewise, Magnitude=M=$\Sigma 2^n b_n$
where $b_n$ is the value of bit n, 0 or 1, and the summation runs from n=0 to N.
E=Position of FSB=fix ($\log_2$ M) for M>=1
R=Residual=M−$2^E$
which has E bits for E>=1 and M>=2.

Given the representation of FIG. 1, to transmit data across a communications channel, in this embodiment, values of S (if appropriate) may be provided along with a positional value E and a value of a residual R. In one embodiment, the residual value is not encoded, and the bits may be simply sent one by one, but the claimed subject matter may not be so limited. However, in this embodiment, an assumption may be made that all possible values of R are equally likely, or sufficiently equally. However, if the base K is not 2 or a power of 2, the coding of R into a binary representation may not be efficient. The radix coder however solves this by disclosing a method of coding values s whose range 1 to g (or 0 to g−1) may not be a power of 2 but for which the assumption that all values of s are equally likely may be acceptable.

As is well known, Golomb Coding works well at least in part because the probability density of R is normally relatively flat, even in cases where the probability density of M is uneven or skewed. The skewness of the distribution may be largely represented in the distribution of E, although even that may be generally well-behaved. There may be a smoothing effect on E because any value of E which is greater than 1 covers a range of $2^E$ different values of M. There is a flattening effect on R because the number of values of R is less than the number of possible values of M.

One aspect of Golomb Coding is that a number, which might or might not be a run length, is coded in two parts, one by an exponent E whose probabilities may vary widely resulting in a probability distribution that is not flat, and the other R value of a fraction of E bits which may have a relatively but not perfectly flat probability. One embodiment may employ a radix coder to code the R value fractional part of a Golomb Code, particularly if the base K is not a power of 2.

As described in co-pending U.S. Patent Application titled COMBINATORIAL CODING/DECODING FOR ELECTRICAL COMPUTERS AND DIGITAL DATA PROCESSING SYSTEMS, by Donald M. Monro; U.S. Patent Application titled BLOCKING FOR COMBINATORIAL CODING/DECODING FOR ELECTRICAL COMPUTERS AND DIGITAL DATA PROCESSING SYSTEMS, by Donald M. Monro; and/or U.S. Patent Application titled IMPROVED BLOCKING FOR COMBINATORIAL CODING/DECODING FOR ELECTRICAL COMPUTERS AND DIGITAL DATA PROCESSING SYSTEMS, by Donald M. Monro, a combinatorial coder may achieve a run length or other code by coding in two parts, in which the probabilities of the first part r may vary widely as in Golomb Coding of E, but the probabilities of the second part s may be perfectly or nearly flat, although these are merely example embodiments, and the scope of claimed subject matter is not so limited. This discovery allows very efficient run length coding, particularly if a method may be used to code the second part of the code s which is perfect or nearly perfect in the sense that the theoretical cost of coding s may be achieved. The radix coder is one method of doing this in the case where the symbols may be sent in one long message. In some instances, it may be acceptable to decode the symbols in the reverse order that they were coded by a radix coder. This may be referred to as a radix coder implemented as a Last In First Out (LIFO) system, and may often be suitable as will be described below in more detail. As will be described, a sequence of values of different radix may be coded in this way provided the coder and decoder may select the identical radix to be used for each value.

With such a combinatorial coder, a sequence of binary symbols of length n bits may be selected and it may be desired to code the occurrences of a particular binary symbol. This may be similar to run length coding except that in principle several runs may be coded at once. That is to say, if there are r occurrences of the binary symbol in the sequence of n bits, the combinatorial coder codes runs of occurrences (or equivalent non-occurrences) of the binary symbol. In this example, a first binary symbol code r indicative of the number of occurrences of the binary symbol within the grouping of data to be compressed may be generated, and a second binary symbol code s indicative of the pattern of occurrences of the binary symbol code may be generated. Likewise, for further groupings of data, this may be repeated. Respective binary symbol codes may then be combined to form a data code. A resulting data code may be a compressed form of the set or grouping of data. This data code may be transmitted or stored as desired.

Such a combinatorial coder may operate efficiently with a small number of symbols and short groupings or blocks of data, as just an example. It may, for example, be useful if data is a sequence of Binary digits in which two states occur, such as 'on' and 'off', or 'red' and 'green' or 'guilty' and 'not guilty'. Such binary data may in one or more embodiments be represented as a series of the digits '0' and '1'. Accordingly, such a combinatorial coder may be used to code runs or patterns of binary data and may be a viable alternative to previously known methods such as arithmetic coding or Golomb coding over which it has relative advantages as will be described. Alternatively, non-binary data may also be processed by the methods described herein. Additionally, it is worthwhile to note that a radix coder in accordance with one or more embodiments is not limited in its application to a combinatorial coder or a Golomb coder or to any other application.

A radix coder operates by taking an initial message which may be empty and adding symbols $s_t$ to it which may be indicative of values in a range $g_t$, said range or radix $g_t$ being indicative of the number of values that the particular symbol may take. As coding of symbols progresses the message grows in length. If the message is a binary number, as it grows the process that defines the code may cause many of the bits of the message to change as the message is constructed, so that the final bit pattern of the message is not known until all symbols have been coded.

Figure 2:
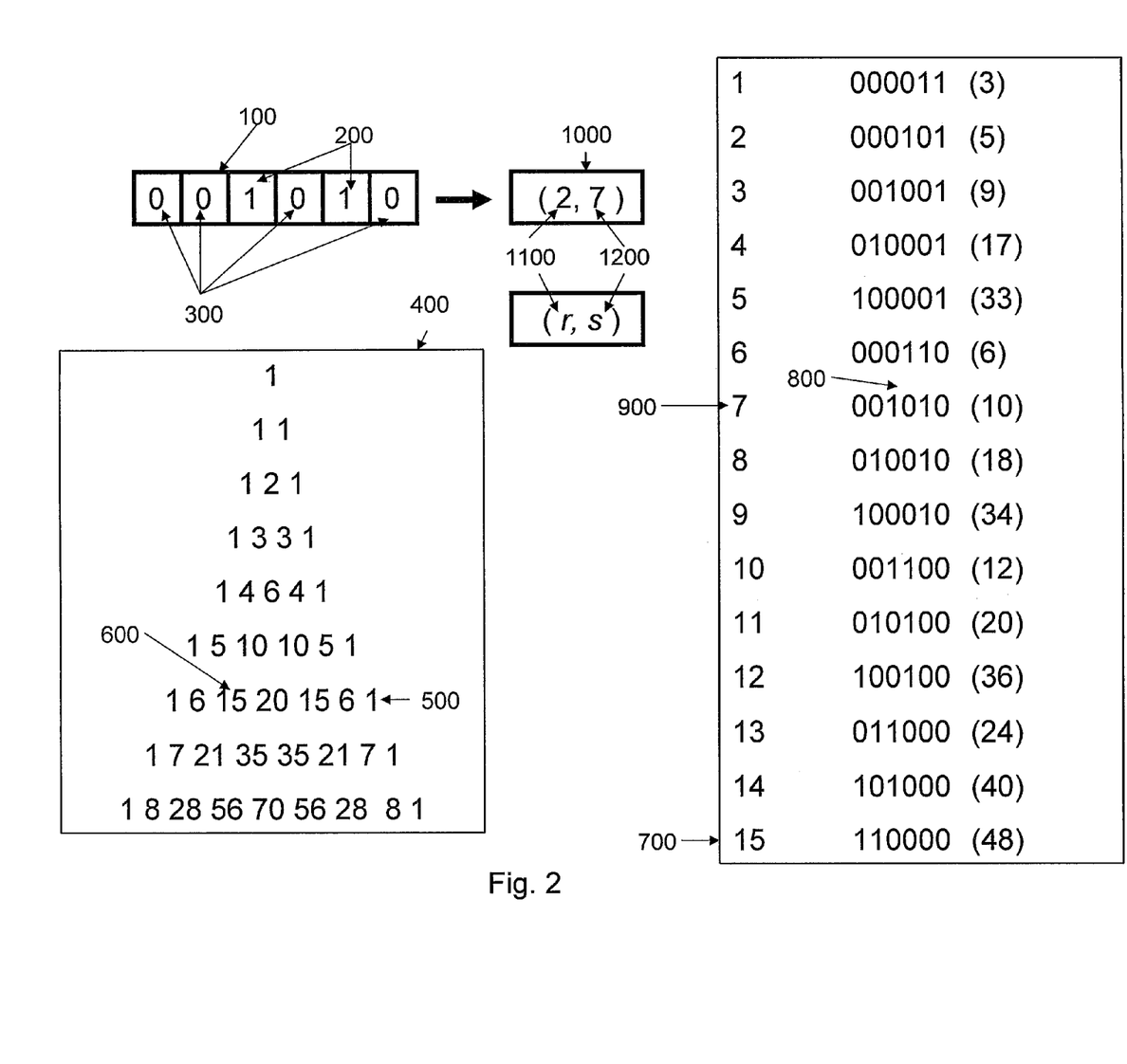
FIG. 2 is a diagram illustrating an example technique for data coding in accordance with one or more embodiments.

Referring now to FIG. 2, there is illustrated an example embodiment of coding data. In this embodiment, a sequence of 6 binary bits 100 may be encoded by employing a combinatorial coder such as described in co-pending U.S. Patent Application titled COMBINATORIAL CODING/DECODING FOR ELECTRICAL COMPUTERS AND DIGITAL DATA PROCESSING SYSTEMS, by Donald M. Monro; U.S. Patent Application titled BLOCKING FOR COMBINATORIAL CODING/DECODING FOR ELECTRICAL COMPUTERS AND DIGITAL DATA PROCESSING SYSTEMS, by Donald M. Monro; and/or U.S. Patent Application titled IMPROVED BLOCKING FOR COMBINATORIAL CODING/DECODING FOR ELECTRICAL COMPUTERS AND DIGITAL DATA PROCESSING SYSTEMS, by Donald M. Monro, although these are merely example embodiments, and the scope of claimed subject matter is not so limited. However, it is worthwhile to note that any length of sequence might be used and this is simply for illustrative purposes. In this embodiment, binary sequence 100 is a pattern which contains '0' bits in certain positions 200 and '1' bits in other positions 300. The coder examines the binary sequence 100 and in particular determines that there may be two '1' bits 200 in the pattern. Although there are $2^6=64$ different patterns of 6 bits, as is generally known, there is a certain number of patterns or combinations of 6 bits including two '1' bits, usually called $_6C_2=15$, which is much less than 64. The table of numbers 400 is well known as Pascal's triangle, and lists all the values of $_nC_r$ for row n from 0 to 8 with r counting across each row starting from 0. As is well known, each number in the triangle is the sum of the two immediately above it, so the table may be rapidly constructed, and also that the sum of the numbers across row n is $2^n$, i.e. the number of different patterns of n bits. To code the binary sequence 100, the number of '1' bits is 2 and it is noted in Pascal's triangle 400 in row 6 that for r=2 at 600 there are 15 patterns corresponding to r=2. The 15 patterns are listed in table 700, from which it is found at 800 that pattern number 7 at 900 is the one corresponding to the data 100. The code for data 100 is therefore the two symbols at 1000 which are (2, 7), or in general (r, s). The code to describe data 100 is in two parts at 1000, a first code r 1100 that represents 2 and a second code s 1200 that represents 7. This code may contain fewer than 6 bits and if so the data 100 may be compressed by the code 1000. Equally the coder might have determined the number of '0' bits 300 as 4, which would give 4 as the first code r and one of 15 patterns with 4 zeros as the second code s, because $_6C_4$ is the same as $_6C_2$=15.

A combinatorial coder and decoder may refer to lists of patterns s for different lengths of sequences n and different numbers of '1' bits r within these sequences. In general there are $2^n$ different patterns of the data but only $_nC_r$ patterns with r bits, which is always less than $2^n$. The method relies on this fact, that $_nC_r$ is always less than $2^n$, to achieve compression. The lists of patterns may be ordered in any convenient way which enables the coder and decoder to select the same pattern s. Alternatively they may be calculated by a coder or decoder if required. The method may be referred to as Combinatorial Coding because it may be based at least in part on selecting ordered combinations to describe the positions of binary symbols in the data, in this case the binary symbol being the binary digit '1'.

Similarly, a coder and decoder may be employed with '0' bits. If there are r '1' bits in data of n bits, then there are n−r '0' bits. Accordingly, the first code may be n−r and the second code may indicate a pattern with n−r '0' bits. The number of patterns with n−r bits is $_nC_{n-r}$ which is always the same as $_nC_r$. The number of bits r may efficiently be coded by Huffman, Golomb, hybrid Huffman/Golomb as taught in U.S. patent application Ser. No. 11/422,316, arithmetic coding or any other method. It is taught in U.S. patent application Ser. No. 11/422,316 that the hybrid Huffman/Golomb coder may outperform Huffman coding in some circumstances and that it even approaches the efficiency of Huffman coding with probability distributions that may be particularly suitable for Huffman coding. As the hybrid Huffman/Golomb coder is of relatively low complexity, it may be used to code the number of bits r in one or more embodiments of this invention, although the scope of the claimed subject matter is not so limited.

The pattern number s may similarly be coded by Huffman, Golomb, hybrid Huffman/Golomb as taught in U.S. patent application Ser. No. 11/422,316, arithmetic coding and/or the like, including methods not described in detail. In this embodiment, once r is known, all the $_nC_r$ possible patterns are equally likely. Were $_nC_r$ a power of 2, the coder may do no better than code s by $\log_2(_nC_r)$ bits, as will be known to any practitioner skilled in the art. Sometimes this occurs, and sometimes $_nC_r$ is just less than a power of 2. In both these instances, as they arise, the coder may simply use $\log_2(_nC_r)$ bits without further coding. Efficient coding of $_nC_r$ equally probable outcomes if $_nC_r$ is not a power of 2 may be done by the radix coder.

The mathematics in the binary case or embodiment may prove instructive. Working with '1' as the coded digit, let the probability of occurrence of a '1' be q over both long and short blocks of binary data, i.e. q is constant. In an embodiment, the theoretical cost, or entropy, of coding of each bit from this data is:

$$e_q(1) = -q\log_2(q) - (1-q)\log_2(1-q)$$

In a block of n bits, then, the probability of r bits which are '1' is:

$$p_q(r) = q^r(1-q)^{n-r}$$

The entropy, or theoretical cost of coding each bit by an efficient method is:

$$e_q(n) = -\sum_{r=0}^{n} p_q(r)\log_2 p_q(r) \text{ bits.}$$

At n=1 this gives the identical result to $e_q(1)$, so that the theoretical total cost of coding n bits is $ne_q(n)$ bits.

The combinatorial coder considers the different patterns that might occur. There are $_nC_r$ possible patterns of r bits from n, and each is equally likely, so the probability of a pattern of r bits from n is $c_q(n,r) = {_nC_r}p_q(r)$. The theoretical cost of using the technique described herein here may be calculated, in one embodiment, as the cost of selecting a value of r and the cost of sending the selected pattern s. Because each pattern of r bits is equally probable, coding the pattern number s by a perfect method would cost $\log_2(_nC_r)$ bits. Therefore using the probability of each value of r, the theoretical cost of using the method to code n bits is:

$$e_q^*(n) = -\sum_{r=0}^{n} c_q(n,r)\log_2(c_q(n,r)) + \sum_{r=0}^{n} c_q(n,r)\log_2(_nC_r)$$

It may occur that $e_q^*(n) = ne_q(n)$, i.e. that a perfect method of coding r and s will achieve perfect coding of the binary data. The technique illustrated is therefore capable of perfect compression performance for embodiments or instances where q is constant. The same result may be obtained in embodiments where Action 220 of FIG. 2 resulted in using '0' as the binary digit whose occurrences are counted.

Gradually, in this manner, a set of data may be coded. As coding proceeds, a coder may transmit to a decoder information about binary symbols that have been located, such as position(s), in real time for some embodiments. Alternatively, coded data may be stored locally as a compressed representation.

The combinatorial coder, as described above, may be expressed in pseudo-code as follows:

```
For A = Binary symbol
    Indicate R=Number of Occurrences of A
    Indicate the particular pattern S of R Occurrences
End
```

In one embodiment, a radix coder may be employed to code symbols whose range may not be a power of 2 but whose probabilities are equally likely, or nearly equally likely, or acceptably equally likely. Consider a sequence of symbols s whose range is 0 to g−1, in which g comprises the radix of the code. A message m may be formed which may comprise a very large integer number into which symbols may be coded.

Initially, m may be set to zero. As is well known, a computing device may represent integer numbers by using a 'word' comprising a certain number of bits, which may be limited. However it is well known that arbitrarily large numbers may be represented by using multiple words. Methods of representing arbitrarily large numbers and performing arithmetic operations on them are not described herein but it is known to experts in the field that it is possible and feasible to do so.

Figure 3:
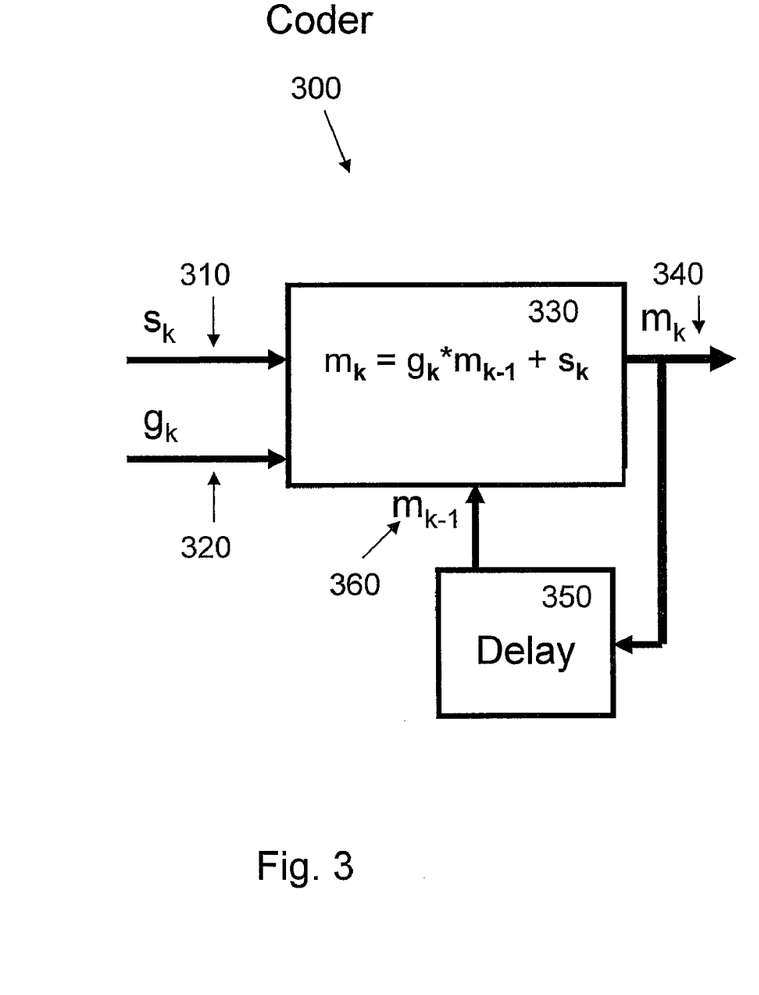
FIG. 3 is a diagram illustrating an example technique for data coding in accordance with one or more embodiments.

Referring now to FIG. 3, there is illustrated a flow diagram of a process 300 of coding a number from 0 to g−1 according to an embodiment. However, initially, it is worthwhile to note that a range of 0 to g−1 may be equivalent to coding numbers in the range 1 to g, as conversion from one range to the other may be accomplished by subtracting 1 before coding and adding one after decoding. In this embodiment, initially, the value of the message m is set to zero. This may be referred to as $m_0$. To insert a first symbol $s_1$ into the code, it is simply added to $m_0$ to give $m_1$, i.e.:

$$m_1 = m_0 + s_1$$

Of course, knowing that $m_0=0$, one may have simply started with $m_1=s_1$. Now the range of $s_1$ is 0 to g−1, so there is no ambiguity in the code if we add a second symbol by:

$$m_2 = g * m_1 + s_2 \qquad (1)$$

In a binary digital apparatus, the bits representing $s_1$ and $s_2$ may not in general be separated in a simple way, as they may be in the case where g is a power of 2, by shifting $s_1$ left before adding $s_2$. Many of the bits of the message are likely to change if $m_1$ is multiplied by g, and again if $s_2$ is added so that merely extracting the bits of the code will not decode the message.

This process may be repeated to code as many values of s as is desired. In general if t−1 symbols $s_1 \ldots s_{t-1}$ of range 0-g, $s_1 \ldots s_{t-1}$ have previously been coded into a message $m_{t-1}$, another symbol $s_t$ may be coded by:

$$m_t = g * m_{t-1} + s_t \qquad (1a)$$

Equation 1a describes the radix LIFO coder with fixed radix g. Once $m_{t-1}$ has been used to calculate $m_t$, $m_{t-1}$ is no longer required. Therefore a saving in memory is achieved by reusing the message. Calling the message m, it is recalculated as each symbol $S_t$ is coded i.e. by a recurrence:

$$m = g * m + s_t \qquad (2)$$

In at least one embodiment, the radix coder may also be extended to be a multiradix coder. It may be a further aspect of the radix coder that the radix g used with successive values of s does not need to be the same. Referring, for example, to the combinatorial coder, it will be understood that the value of r will change as successive groups of binary symbols are coded, and each time the range of s may be $0$-$_nC_r$. Provided the coder may communicate the value of r to the decoder, it may be possible to change the value of r as often or as seldom as may be advantageous. Also referring to the Golomb Coder, the range of the residual R depends on exponent E. R is a number in the range 0 to $K^{E-1}$. This is a number which may be suitable for coding by the radix coder. In one embodiment, an assumption may be made that the radix $g=K^E$ or alternatively the value of E may be communicated by some means to the decoder. Alternatively, the radix $g=K^E$ may be otherwise determined by the decoder in response to received information or in some other way not disclosed herein in detail.

As each symbol $s_t$ is coded, a radix $g_t$ may be used. In this way the radix g may change as often as may be advantageous for the particular coding task. The variable radix LIFO coder may therefore be expressed as:

$$m = g_t * m + s_t \qquad (3)$$

In the following description, the decoding process works backwards through the symbols, as is necessitated by the encoding by the LIFO method described above. Accordingly, the decoding process works backwards through the symbols so that at each step $m_{t-1}$ is recovered from $m_t$. As described herein, as well as in the following claims and figures, the decoding process may be described as recovering something called $m'_{k+1}$ from $m_k$, which is equivalent to recovering $m_{t-1}$ from $m_t$. Here, the k runs in the opposite direction from the t. For example, due to the encoding by the LIFO method the process of recovering $m'_{k+1}$ from $m_k$ utilizes k running from k to 1, in the opposite direction from the t.

Embodiments of a decoding process will now be described. Continuing the example where there are only two symbols coded of radix g, $s_2$ can be recovered by extracting the remainder if $m_2$ is divided by g:

$$s_2 = \mathrm{mod}(m_2, g)$$

where the mod function calculates the integer remainder if $m_2$ is divided by g. This is easily seen to be identical to the calculation:

$$s_2 = m_2 - g * \mathrm{fix}\left(\frac{m_2}{g}\right)$$

where $$\mathrm{fix}\left(\frac{m_2}{g}\right)$$

rounds the quotient $$\frac{m_2}{g}$$

to the integer of next lowest magnitude. At the same time the previous message $m_1$ can be recovered by:

$$m_1 = \mathrm{fix}\left(\frac{m_2}{g}\right)$$

Similarly $s_1$ is recovered by:

$$s_1 = \mathrm{mod}(m_1, g)$$

Although from the discussion above we also know that $s_1 = m_1$.

In the general case, if we have message $m_t$, we recover $s_t$ and $m_{t-1}$ from it by:

$$s_t = \mathrm{mod}\,(m_t, g); \qquad (4)$$

and $$m_{t-1} = \mathrm{fix}\left(\frac{m_t}{g}\right) \qquad (5)$$

Equations 2 and 3 describe a fixed radix g LIFO decoder for the radix g LIFO encoder of equation 1. As with coding, in decoding we may reuse message m as the decoding proceeds:

$$s_t = \mathrm{mod}\,(g, r) \qquad (6)$$

$$m = \mathrm{fix}\left(\frac{m}{g}\right) \qquad (7)$$

Equations 6 and 7 describe a decoder for a coder described by equation 2. In the case of equation 3, where the radix g may vary from symbol to symbol, decoder may be described by $$s_t = \text{mod}(m, g_t) \qquad (8)$$

$$m = \text{fix}\left(\frac{m}{g_t}\right) \qquad (9)$$

Taking a specific numerical example, suppose the radix g=5, and begin with $m_0$=0. If the first number to be coded, $s_1$, is 3, $m_1$=3. To code a next number $s_2$=4 we calculate $m_2$=3*5+ 4=19. In effect the numbers 3 and 4 are contained within the value 19. One experienced in the field would recognize that 19 converted to base 5 would be $3_5 4_5$. To decode, the last digit coded, $s_2$, is recovered by mod(19,5) which is 4, and $s_1=m_1=$fix(19/5)=3. Of course, this is just one example, and the scope of the claimed subject matter is not so limited.

Where it is acceptable to receive the coded symbols and decode symbols in reverse order, as may be the case in coding and decoding an image in a sequence or a block of audio, the LIFO radix coder may code the sequence of values of s. Each value $s_t$ may have an associated radix $g_t$. In the examples above, two symbols whose range is not a power of 2 have been coded and then decoded, however the last symbol to be coded into the message has been recovered first. This may be describes as a Last In First Out or LIFO radix coder. As described, such a LIFO radix coder results in the decoder recovering symbols in the reverse order that the coder entered them.

Referring to FIG. 3, a flow diagram illustrates an example procedure embodiment in accordance with one or more embodiments, although the scope of claimed subject matter is not limited in this respect. Procedure embodiment 300 illustrated in FIG. 3 may be used to code symbols from a sequence of data symbols, the data symbols each having a radix, for example, although the scope of claimed subject matter is not limited in this respect. Additionally, although procedure embodiment 300, as shown in FIG. 3, comprises one particular order of blocks, the order in which the blocks are presented does not necessarily limit claimed subject matter to any particular order. Likewise, intervening blocks shown in FIG. 3 and/or additional blocks not shown in FIG. 3 may be employed and/or blocks shown in FIG. 3 may be eliminated, without departing from the scope of claimed subject matter.

Procedure embodiment 300 depicted in FIG. 3 may in alternative embodiments be implemented in software, hardware, and/or firmware, and may comprise discrete operations. As illustrated, procedure embodiment 300 implements the method of equation 3. Message 360 is updated by the coder 300. Symbol 310 and radix 320 are received into processing block 330. Delayed message 360 is empty before processing begins. Delayed message 360 is updated by block 330 to produce new message 340. Message 340 is delayed by block 350 to provide delayed message 360. Delayed message 360 is received by block 330 and further updated as the coding proceeds.

Figure 4:
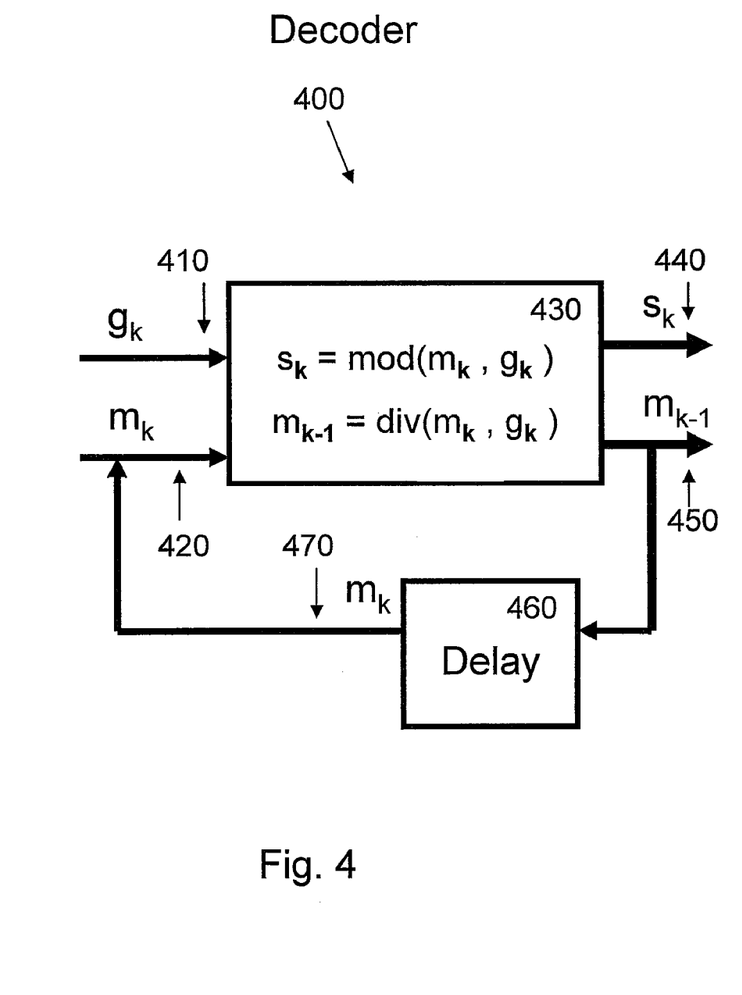
FIG. 4 is a diagram illustrating an example technique for data decoding in accordance with one or more embodiments.

Referring to FIG. 4, a flow diagram illustrates an example procedure embodiment in accordance with one or more embodiments, although the scope of claimed subject matter is not limited in this respect. Procedure embodiment 400 illustrated in FIG. 4 may be used to decode symbols, for example, although the scope of claimed subject matter is not limited in this respect. Additionally, although procedure embodiment 400, as shown in FIG. 4, comprises one particular order of blocks, the order in which the blocks are presented does not necessarily limit claimed subject matter to any particular order. Likewise, intervening blocks shown in FIG. 4 and/or additional blocks not shown in FIG. 4 may be employed and/or blocks shown in FIG. 4 may be eliminated, without departing from the scope of claimed subject matter.

Procedure embodiment 400 depicted in FIG. 4 may in alternative embodiments be implemented in software, hardware, and/or firmware, and may comprise discrete operations. As illustrated, procedure embodiment 400 decodes messages 340 produced by the radix coder of FIG. 3. radix 410 and message 420 are received by processing block 430. Block 430 produces symbol 440 and previous message 450. Previous message 450 is delayed by block 460 to produce message 470. Previous message 470 is further used with previous radix 410 to recover further symbol 440 and previous message 450. Process 400 may be repeated until all symbols 440 are recovered.

Figure 5:
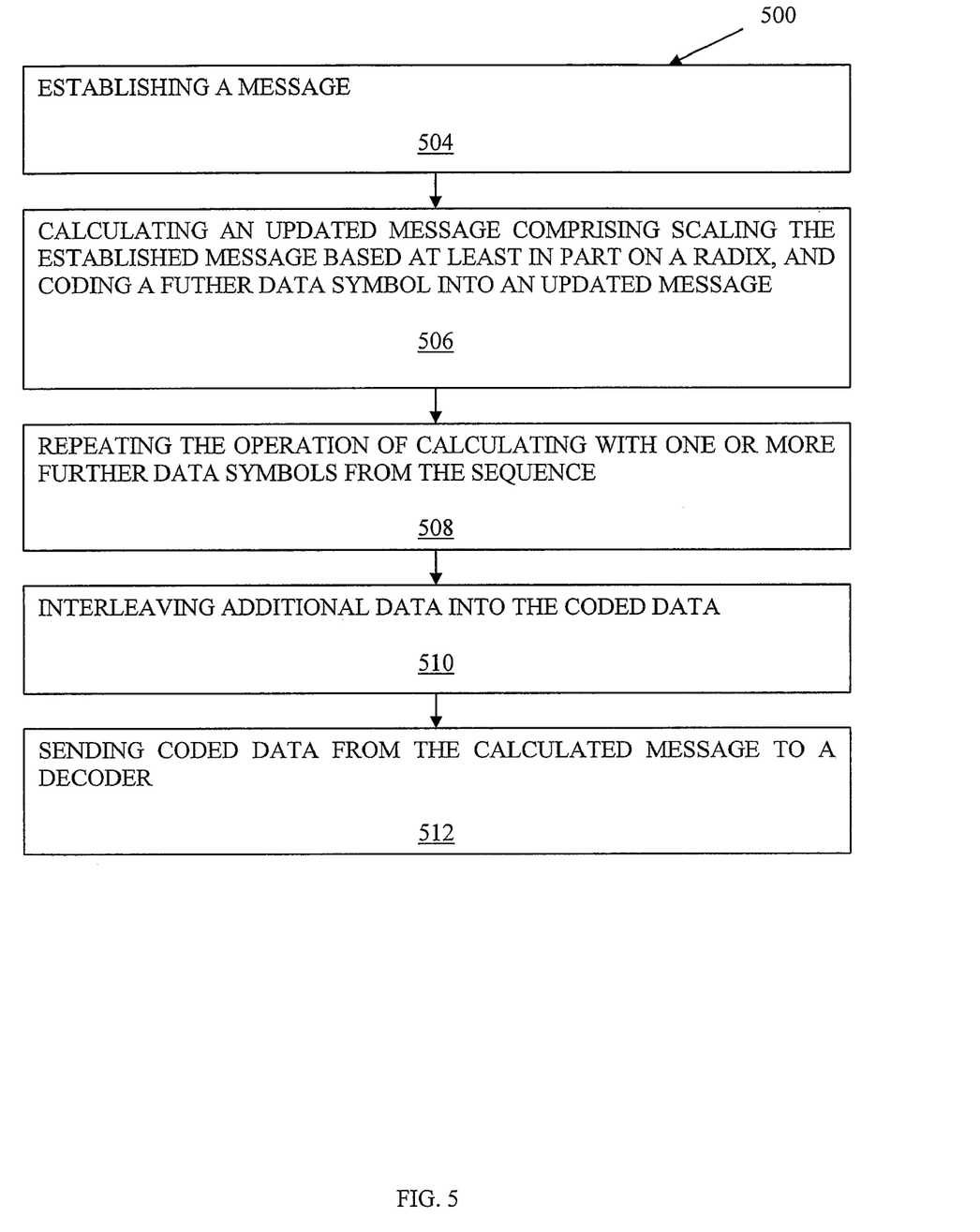
FIG. 5 is a flow diagram illustrating an example procedure for data coding in accordance with one or more embodiments.

Referring to FIG. 5, a flow diagram illustrates an example procedure embodiment in accordance with one or more embodiments, although the scope of claimed subject matter is not limited in this respect. Procedure embodiment 500 illustrated in FIG. 5 may be used to code data symbols from a sequence of data symbols, where the data symbols each have a radix, for example, although the scope of claimed subject matter is not limited in this respect. Additionally, although procedure embodiment 500, as shown in FIG. 5, comprises one particular order of blocks, the order in which the blocks are presented does not necessarily limit claimed subject matter to any particular order. Likewise, intervening blocks shown in FIG. 5 and/or additional blocks not shown in FIG. 5 may be employed and/or blocks shown in FIG. 5 may be eliminated, without departing from the scope of claimed subject matter.

Procedure embodiment 500 depicted in FIG. 5 may in alternative embodiments be implemented in software, hardware, and/or firmware, and may comprise discrete operations. As illustrated, procedure embodiment 500 starts at block 504 where a message may be established. For example, the establishing of the message may be based at least in part on an initial data symbol from the sequence. Additionally or alternatively, the sequence of data symbols may comprise a mixed radix or a unitary radix. Further, the sequence of data symbols may comprises a second part of a code resulting from combinatorial coding. At block 506, an updated message may be calculated, where the calculating may comprise scaling the established message based at least in part on a radix, and coding a further data symbol into an updated message. For example, the scaling may comprise scaling the established message based at least in part on the radix corresponding to the further data symbol to be coded. It will be evident to one experienced in the field that the updated message may be physically the same message as the established message. For example, the updated message may reuse the same memory used for the established message, extending the established message as necessary. Additionally or alternatively, the operation of scaling the established message may comprise shifting the established message to the left based at least in part on a unitary radix of a power of two for the sequence of data symbols. At block 508, the operation of calculating may be repeated with one or more further data symbols from the sequence. For example, the operation of calculating may be repeated until all desired symbols have been coded. At block 510, additional data may be interleaved into the coded data. For example, additional data regarding mixed radix values from the sequence of data symbols may be interleaved into the coded data. At block 512, coded data may be sent from the calculated message to a decoder.

As may be appreciated, whenever g is a power of 2, say $g_t=2^b$, multiplying m by $g_t=2^b$ is the same as shifting m to the left by b bits. For convenience, it may be desirable to represent binary numbers with the least significant bit, signifying value 0 at the right hand end of the binary number. Of course, this may be an accepted notation for representing binary numbers, but may not comprise an exact representation of their organization if implemented in hardware and/or software, for example. In one embodiment, this accepted notation may be utilized if g is a power of 2, and the radix coder may be implemented by shifting the message m by b bits to the left before adding the value of s. Alternatively, bits that comprise s may be pushed into the right hand end of the message m, shifting m to the left before each bit of s is pushed in, doing this for each of the b bits of s. The bits of s could, of course, be taken in any order, such as reverse; the scope of the claimed subject matter is not so limited. Consider that the leftmost bit of s is pushed in first, as may be the case if s is introduced by adding s to the shifted m rather than pushing the bits in. The decoder having information regarding the radix g of the next data to be decoded may be relatively advantageous in Golomb coding by being able to interleave the values of S and E with the residual R. The coding of E may be by any convenient method, for example by a variable length code such as a Huffman or other code, or an arithmetic code, and may be interleaved with the coding of R according to the present example embodiment. The sign S is capable of representation by a single bit and so in many cases it may be coded by employing a single bit. However, if the signs S are unevenly distributed, the interleaved coding may be by some other method, for example arithmetic or run length coding. The coding of E interleaved by the present example embodiment may be by any method and is not to be limited by the examples given here. It may be relatively advantageous in coding by the combinatorial coder by interleaving the coding of the bit counting symbol r with the coding of the symbol s. The coding of r may be by any method including a variable length code such as a Huffman or other code, or by arithmetic coding to give but two examples. The coding of r interleaved by the present example embodiment may be by any method and is not to be limited by the examples given here.

Binary data may be a fixed number of b binary bits, or it may be a variable number of bits such as may be coded by a variable length code. If the number of bits is known and is b, the bits may be coded as a value of $s_r$ in the range 0 to $2^b-1$, using the present example embodiment with $g_r=2^b$. If the bits arise from a variable length code, they may be inserted one at a time by using the present example embodiment with $g_r=2$. If insertion of interleaved binary data into the right end of a message is performed, the bits comprising the interleaved data remain available at the least significant end of the message, and may be recovered or decoded by shifting them out to the right into a decoded value. However as soon as a radix $g_r$ occurs which is not a power of 2, the interleaved data will no longer be separated in the message as a sequence of b bits. In the decoding process, however, if the decoder comes to a radix that is a power of 2, the bits may be available at the right hand end of the message and may be extracted by a decoder by shifting.

The radix coder may be used to code the residual part R of a Golomb code, which may be used with all Golomb Coders, but may be particularly useful if the Golomb base is not a power of 2. Such a method may include coding the s part of a combinatorial code which may be used to code any value of s, but may be particularly useful in the many cases where $_nC_r$ is not a power of 2. However, such a method may also be mixed with the coding of any other data, and is not limited to Golomb coding or Combinatorial Coding but may be applicable to the coding of a wide range of other data types and is not to be taken to be limited to the examples given herein.

It may be desirable to predict the efficiency of a coding process. For example, binary notation may assist the prediction of the efficiency of the coding process including the effect of using a particular length of message as in the claimed subject matter. Working with '1' as the coded digit, let the probability of occurrence of a '1' be q over both long and short blocks of binary data, i.e. q is constant. As is well known to practitioners in the field, the theoretical cost, or entropy, of coding of each bit from this data may be expressed as:

$$e_q(1) = -q\log_2(q) - (1-q)\log_2(1-q)$$

The entropy, or theoretical cost of coding each bit by an efficient method may be expressed as:

$$e_q(n) = -\sum_{r=0}^{n} p_q(r)\log_2 p_q(r) \text{ bits.}$$

At n=1 this gives the identical result to $e_q(1)$, and with other values of n the theoretical total cost of coding n bits is $ne_q(n)$ bits. In a block of n bits, then, the probability of one particular pattern in which r bits are '1' may be expressed as:

$$p_q(r) = q^r(1-q)^{n-r}$$

However $_nC_r$ different patterns of r bits from n might occur. The Combinatorial coder considers the different patterns that might occur. The probability of any of the possible $_nC_r$ patterns of r bits from n is $c_q(n,r) = _nC_r p_q(r)$, so that the theoretical cost of using the combinatorial coder may easily be calculated as the cost of selecting a value of r and the cost of sending the selected pattern s. Because each pattern of r bits is equally probable, coding the pattern number s by a perfect method would cost $\log_2 r$ bits. Therefore using the probability of each value of r, the theoretical cost of using the method to code n bits may be expressed as:

$$e_q^*(n) = -\sum_{r=0}^{n} c_q(n,r)\log_2(c_q(n,r)) + \sum_{r=0}^{n} c_q(n,r)\log_2(_nC_r)$$

It may be shown that $e_q^*(n) = ne_q(n)$, i.e. that a perfect method of coding r and s will achieve perfect coding of the binary data. The radix coder is therefore capable of perfect compression performance if q is constant. The total theoretical pattern cost of a message of N symbols $s_n$ each with radix $g_n$ is:

$$\sum_{n=1}^{N} \log_2 g_n$$

The coded data may be efficiently communicated or stored by the radix coder as one long message. In practice this is possible within one bit of the total theoretical value, simply by sending all the bits necessary to describe the message. For example if the message has a theoretical cost of 465328.67 bits, it would be possible to achieve this in 465329 bits. In a practical application or for convenience a system might increase this further to be an exact number of bytes or words or blocks, but in principle efficiency to the rounded up exact number of bits is achievable. This may be true if the coder and decoder knew in advance the length of the message and the radices to be used. It does not include the cost of sending the radices g, or the cost of sending the length of the message or alternatively of terminating it by some special code. As may be seen from the foregoing description, embodiments described herein may be employed when it may be applied to coding of data of all types, including non-numeric data, such as symbolic data, for example, converted into binary form by any convenient mapping prior to application of coding. For example, embodiments described herein may be employed for run length coding, although it will, of course, be understood that claimed subject matter is not limited to that application, and may be applied to any one of a number of different types of data coding. Therefore, claimed subject matter is not intended to be limited in terms of the type of data to which it may be applied.

Figure 6:
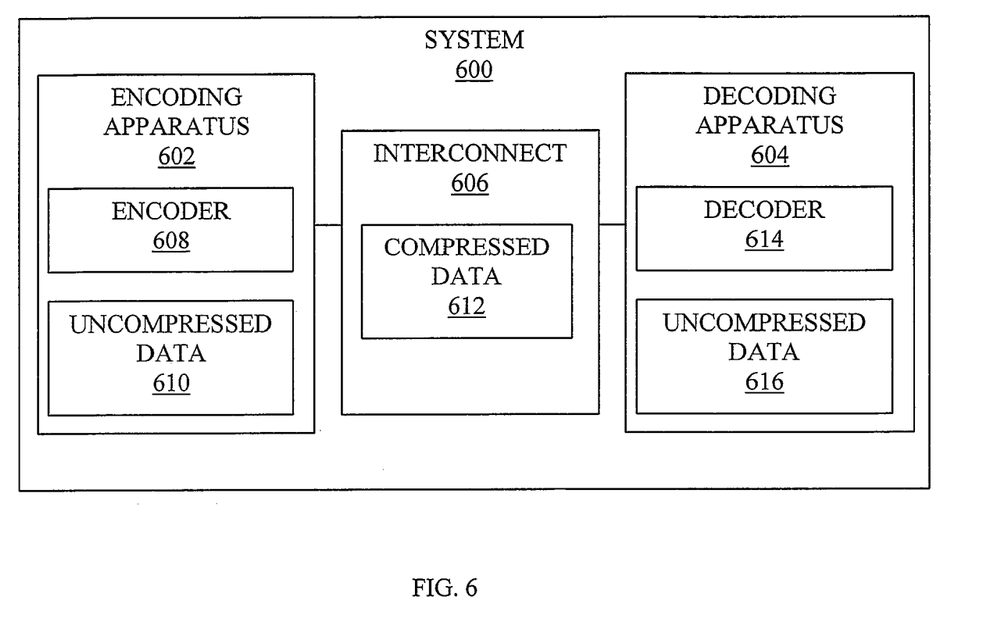
FIG. 6 is a schematic diagram illustrating an example system and/or an apparatus in accordance with one or more embodiments.

FIG. 6 is a block diagram illustrating an example embodiment of a system 600 comprising an encoding apparatus 602 and a decoding apparatus 604 in accordance with the claimed subject matter. In one embodiment, system 600 may include encoding apparatus 602, decoding apparatus 604 and an interconnect 606. Communication between encoding apparatus 602 and decoding apparatus 604 may performed over interconnect 606. For example, interconnect 606 may permit communication between functional units in a single device, between two dies sharing a package, and/or between two devices in a computing platform, such as is described below in FIG. 7. Alternatively or additionally, interconnect 606 may be may be a network, which permits remote communication between two devices.

In one embodiment, encoding apparatus 602 may include an encoder 608 which may be capable of performing one or more techniques as described above and illustrated in FIGS. 1, 2, 3, and/or 5. In an embodiment, encoder 608 may take uncompressed data 610 and encode it, or a portion of it, into compressed data 612. In one embodiment, encoding apparatus 602 may transmit compressed data 612 to decoding apparatus 604 via interconnect 606.

In one embodiment, decoding apparatus 604 may include a decoder 614, which may be capable of performing the reverse of the technique as described above and illustrated in FIGS. 1, 2, 3, and/or 5. For example, decoder 614 may be capable of performing decoding technique as described above and illustrated in FIG. 4. Decoder 614 may take compressed data 612 and decode it, or a portion of it, into uncompressed data 616. System 600 described above is not limited to any particular hardware or software configuration and all or part of system 600 may find applicability in any computing or processing environment such as is described below in FIG. 7. for example Referring to FIG. 7, a block diagram of a computing platform 700 according to one or more embodiments is illustrated, although the scope of claimed subject matter is not limited in this respect. Computing platform 700 may include more and/or fewer components than those shown in FIG. 7. However, generally conventional components may not be shown, for example, a battery, a bus, and so on.

Figure 7:
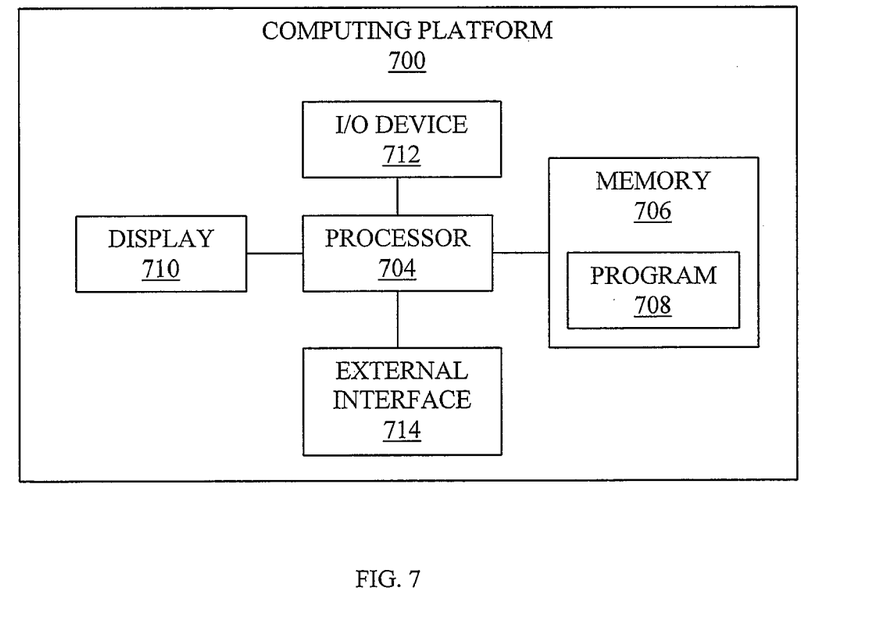
FIG. 7 is a schematic diagram of an example computing platform in accordance with one or more embodiments.

Computing platform 700, as shown in FIG. 7 may be utilized to embody tangibly a computer program and/or graphical user interface by providing hardware components on which the computer program and/or graphical user interface may be executed. Computing platform 700 may be utilized to embody tangibly all or a portion of procedure embodiment 500 of FIG. 5 and/or other procedures disclosed herein. Such a procedure, computer program and/or machine readable instructions may be stored tangibly on a computer and/or machine readable storage medium such as a compact disk (CD), digital versatile disk (DVD), flash memory device, hard disk drive (HDD), and so on. As shown in FIG. 7, computing platform 700 may be controlled by processor 704, including one or more auxiliary processors (not shown). Processor 704 may comprise a central processing unit such as a microprocessor or microcontroller for executing programs, performing data manipulations, and controlling the tasks of computing platform 700. Auxiliary processors may manage input/output, perform floating point mathematical operations, manage digital signals, perform fast execution of signal processing algorithms, operate as a back-end processor and/or a slave-type processor subordinate to processor 704, operate as an additional microprocessor and/or controller for dual and/or multiple processor systems, and/or operate as a coprocessor and/or additional processor. Such auxiliary processors may be discrete processors and/or may be arranged in the same package as processor 704, for example, in a multicore and/or multithreaded processor; however, the scope of the scope of claimed subject matter is not limited in these respects.

Communication with processor 704 may be implemented via a bus (not shown) for transferring information among the components of computing platform 700. A bus may include a data channel for facilitating information transfer between storage and other peripheral components of computing platform 700. A bus further may provide a set of signals utilized for communication with processor 704, including, for example, a data bus, an address bus, and/or a control bus. A bus may comprise any bus architecture according to promulgated standards, for example, industry standard architecture (ISA), extended industry standard architecture (EISA), micro channel architecture (MCA), Video Electronics Standards Association local bus (VLB), peripheral component interconnect (PCI) local bus, PCI express (PCIe), hyper transport (HT), standards promulgated by the Institute of Electrical and Electronics Engineers (IEEE) including IEEE 488 general-purpose interface bus (GPIB), IEEE 696/S-100, and so on, although the scope of the scope of claimed subject matter is not limited in this respect.

Other components of computing platform 700 may include, for example, memory 706, including one or more auxiliary memories (not shown). Memory 706 may provide storage of instructions and data for one or more programs 708 to be executed by processor 704, such as all or a portion of procedure embodiment 500 of FIG. 5 and/or other procedures disclosed herein, for example. Memory 706 may be, for example, semiconductor-based memory such as dynamic random access memory (DRAM) and/or static random access memory (SRAM), and/or the like. Other semi-conductor-based memory types may include, for example, synchronous dynamic random access memory (SDRAM), Rambus dynamic random access memory (RDRAM), ferroelectric random access memory (FRAM), and so on. Alternatively or additionally, memory 706 may be, for example, magnetic-based memory, such as a magnetic disc memory, a magnetic tape memory, and/or the like; an optical-based memory, such as a compact disc read write memory, and/or the like; a magneto-optical-based memory, such as a memory formed of ferromagnetic material read by a laser, and/or the like; a phase-change-based memory such as phase change memory (PRAM), and/or the like; a holographic-based memory such as rewritable holographic storage utilizing the photorefractive effect in crystals, and/or the like; and/or a molecular-based memory such as polymer-based memories, and/or the like. Auxiliary memories may be utilized to store instructions and/or data that are to be loaded into memory 706 before execution. Auxiliary memories may include semiconductor based memory such as read-only memory (ROM), programmable read-only memory (PROM), erasable programmable read-only memory (EPROM), electrically erasable read-only memory (EEPROM), and/or flash memory, and/or any block oriented memory similar to EEPROM. Auxiliary memories also may include any type of non-semiconductor-based memories, including, but not limited to, magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), and so on. Other varieties of memory devices are contemplated as well.

Computing platform 700 further may include a display 710. Display 710 may comprise a video display adapter having components, including, for example, video memory, a buffer, and/or a graphics engine. Such video memory may be, for example, video random access memory (VRAM), synchronous graphics random access memory (SGRAM), windows random access memory (WRAM), and/or the like. Display 710 may comprise a cathode ray-tube (CRT) type display such as a monitor and/or television, and/or may comprise an alternative type of display technology such as a projection type CRT type display, a liquid-crystal display (LCD) projector type display, an LCD type display, a light-emitting diode (LED) type display, a gas and/or plasma type display, an electroluminescent type display, a vacuum fluorescent type display, a cathodoluminescent and/or field emission type display, a plasma addressed liquid crystal (PALC) type display, a high gain emissive display (HGED) type display, and so forth.

Computing platform 700 further may include one or more I/O devices 712. I/O device 712 may comprise one or more I/O devices 712 such as a keyboard, mouse, trackball, touchpad, joystick, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, and/or the like.

Computing platform 700 further may include an external interface 714. External interface 714 may comprise one or more controllers and/or adapters to provide interface functions between multiple I/O devices 712. For example, external interface 714 may comprise a serial port, parallel port, universal serial bus (USB) port, and IEEE 1394 serial bus port, infrared port, network adapter, printer adapter, radio-frequency (RF) communications adapter, universal asynchronous receiver-transmitter (UART) port, and/or the like, to interface between corresponding I/O devices 712. External interface 714 for an embodiment may comprise a network controller capable of providing an interface, directly or indirectly, to a network, such as, for example, the Internet.

It is noted, of course, that claimed subject matter is not limited to particular embodiments. Therefore, in addition to covering methods for coding and/or decoding of data, claimed subject matter is also intended to cover, for example, software incorporating such methods and to coders and/or decoders (whether implemented in hardware or software, or a combination of hardware and software). Claimed subject matter is also intended to include a video or audio codec embodying such methods and/or a video or audio compression system whereby data may be encoded according to a method as described or claimed. For example, embodiments may include transmitting data across a communications channel for reconstruction be a decoder at the far end. Likewise, alternatively, in another embodiment in accordance with claimed subject matter coded data may be stored rather than transmitted. Thus, claimed subject matter is intended to cover these as well as other embodiments.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

What is claimed is:

1. A method comprising:
   establishing, with a processor of a coding device, a message for coding a sequence of data symbols;
   scaling the established message to generate a first updated message, wherein the established message is scaled based at least in part on a first radix of a first data symbol from the sequence of data symbols; and
   scaling the first updated message to generate a second updated message, wherein the first updated message is scaled based at least in part on a second radix of a second data symbol from the sequence of data symbols.

2. The method of claim 1, wherein the first radix is a number of positional patterns associated with a first value within data to be encoded.

3. The method of claim 2, wherein each positional pattern identifies one or more potential positions of the first value within the data.

4. The method of claim 2, wherein the number of positional patterns is based at least in part on a length of the data.

5. The method of claim 2, wherein the number of positional patterns is based at least in part on a number of occurrences of the first value within the data.

6. The method of claim 2, wherein the first data symbol identifies a pattern from the positional patterns, wherein the pattern identifies one or more actual positions of the first value within the data.

7. The method of claim 2, further comprising providing a list of the positional patterns to a decoder.

8. The method of claim 2, further comprising interleaving a number of occurrences of the first value within the data into the established message, the first updated message, or the second updated message.

9. The method of claim 1, wherein scaling the established message comprises multiplying the established message by the first radix to obtain a first product.

10. The method of claim 9, wherein scaling the established message further comprises adding the first data symbol to the first product to obtain the first updated message.

11. The method of claim 10, wherein scaling the first updated message comprises multiplying the first updated message by the second radix to obtain a second product, and adding the second data symbol to the second product to obtain the second updated message.

12. The method of claim 1, further comprising scaling the second updated message one or more times until each data symbol from the sequence of data symbols is coded.

13. The method of claim 1, wherein scaling the established message comprises shifting the established message to the left by b bits, wherein b is based at least in part on the first radix.

14. The method of claim 13, wherein scaling the established message further comprises adding the first data symbol to the shifted established message to obtain the first updated message.

15. The method of claim 13, wherein the first radix comprises a unitary radix of a power of two for the sequence of data symbols.

16. An apparatus comprising:
a memory; and
a processor operatively coupled to the memory, wherein the processor is configured to:
establish a message for coding a sequence of data symbols;
scale the established message to generate a first updated message, wherein the established message is scaled based at least in part on a first radix of a first data symbol from the sequence of data symbols; and
scale the first updated message one or more times based on one or more additional radixes of one or more additional data symbols from the sequence of data symbols to generate a coded message.

17. The apparatus of claim 16, further comprising a transmitter operatively coupled to the processor and configured to transmit the coded message to a decoder.

18. The apparatus of claim 16, wherein the first radix is a number of positional patterns associated with a first value within data to be encoded.

19. The apparatus of claim 18, wherein each positional pattern identifies one or more potential positions of the first value within the data.

20. The apparatus of claim 18, wherein the number of positional patterns is based at least in part on a length of the data and at least in part on a number of occurrences of the first value within the data.

21. The apparatus of claim 18, wherein the processor is further configured to interleave a number of occurrences of the first value within the data into the coded message.

22. The apparatus of claim 16, wherein the processor is further configured to interleave the first radix into the coded message.

23. The apparatus of claim 16, wherein scaling the established message comprises multiplying the established message by the first radix to obtain a first product, and adding the first data symbol to the first product to obtain the first updated message.

24. An apparatus comprising:
means for establishing a message for coding a sequence of data symbols;
means for scaling the established message to generate a first updated message, wherein the established message is scaled based at least in part on a first radix of a first data symbol from the sequence of data symbols; and
means for scaling the first updated message one or more times based on one or more additional radixes of one or more additional data symbols from the sequence of data symbols to generate a coded message.

25. The apparatus of claim 24, further comprising means for transmitting the coded message to a decoder.

26. The apparatus of claim 24, further comprising means for providing a list of the positional patterns to a decoder, wherein each positional pattern identifies one or more potential positions of a first value within data to be encoded.

27. The apparatus of claim 26, wherein the first radix is a number of the positional patterns associated with the first value.

28. The apparatus of claim 24, wherein scaling the established message comprises shifting the established message to the left by b bits, wherein b is based at least in part on the first radix.

29. The apparatus of claim 24, further comprising means for interleaving the first radix into the coded message.

30. A tangible computer-readable medium having stored thereon, computer-executable instructions that, in response to execution by a computing device, cause the computing device to perform a method comprising:
establishing a message for coding a sequence of data symbols;
scaling the established message to generate a first updated message, wherein the established message is scaled based at least in part on a first radix of a first data symbol from the sequence of data symbols; and
scaling the first updated message one or more times to generate a coded message, wherein the first updated message is scaled based on one or more additional radixes of one or more additional data symbols from the sequence of data symbols.

31. The tangible computer-readable medium of claim 30, further comprising interleaving a number of occurrences of a value within data to be encoded into the coded message.

32. The tangible computer-readable medium of claim 30, wherein scaling the established message comprises multiplying the established message by the first radix to obtain a first product, and adding the first data symbol to the first product to obtain the first updated message.

33. The tangible computer-readable medium of claim 30, further comprising interleaving the first radix into the coded message.

34. The tangible computer-readable medium of claim 30, wherein the first radix is a number of positional patterns associated with a first value within data to be encoded.

35. The tangible computer-readable medium of claim 34, wherein each positional pattern identifies one or more potential positions of the first value within the data.

36. A method comprising:
receiving a coded message at a decoding device, wherein the coded message corresponds to a sequence of data symbols;
determining, with a processor of the decoding device, a first radix corresponding to a first data symbol from the sequence of data symbols;
scaling the coded message to identify the first data symbol and to generate an updated message, wherein the coded message is scaled based at least in part on the first radix; and
scaling the updated message one or more times to identify one or more additional data symbols, wherein the updated message is scaled based at least in part on one or more additional radixes corresponding to the one or more additional data symbols.

37. The method of claim 36, wherein scaling the updated message one or more times also generates one or more additional updated messages for use in identifying the one or more additional data symbols.

38. The method of claim 36, wherein the first radix is interleaved into the coded message.

39. The method of claim 36, wherein the first radix is a number of positional patterns associated with a first value within data to be encoded.

40. The method of claim 39, wherein the number of positional patterns is based at least in part on a length of the data.

41. The method of claim 40, further comprising receiving the length of the data and a number of occurrences of the first value within the data.

42. The method of claim 36, wherein the first data symbol comprises a last data symbol encoded into the coded message.

43. An apparatus comprising:
a memory; and
a processor operatively coupled to the memory and configured to:
   determine a first radix corresponding to a first data symbol from a sequence of data symbols;
   scale a coded message to identify the first data symbol and to generate an updated message, wherein the coded message is scaled based at least in part on the first radix; and
   scale the updated message one or more times to identify one or more additional data symbols, wherein the updated message is scaled based at least in part on one or more additional radixes corresponding to the one or more additional data symbols.

44. The apparatus of claim 43, further comprising a receiver operatively coupled to the processor and configured to receive the coded message, wherein the coded message corresponds to the sequence of data symbols.

45. The apparatus of claim 43, wherein scaling the updated message one or more times also generates one or more additional updated messages for use in identifying the one or more additional data symbols.

46. The apparatus of claim 43, wherein the first data symbol comprises a last data symbol encoded into the coded message.

47. The apparatus of claim 43, wherein the processor determines the first radix by de-interleaving the first radix out of the coded message.

48. The apparatus of claim 43, wherein the first radix is a number of positional patterns associated with a first value within data to be encoded.

* * * * *